United States Patent [19]

Reynolds

[11] 3,803,495

[45] Apr. 9, 1974

[54] CHANNEL TUNING ARRANGEMENT

[75] Inventor: Richard G. Reynolds, Sarasota, Fla.

[73] Assignee: Coaxial Scientific Corporation, Sarasota, Fla.

[22] Filed: Apr. 5, 1971

[21] Appl. No.: 130,910

[52] U.S. Cl. .................................. 325/470, 334/29

[51] Int. Cl. .............................................. H04b 1/32

[58] Field of Search ............ 334/11, 15, 17, 18, 29; 178/DIG. 13; 325/308, 469, 470, 471

[56] References Cited

UNITED STATES PATENTS

| | | | |
|---|---|---|---|
| 3,302,119 | 1/1967 | Bell | 325/471 |
| 3,535,640 | 10/1970 | Forrest, Jr. | 325/308 |
| 3,568,065 | 3/1971 | Pagany et al. | 325/470 |
| 3,571,720 | 3/1971 | Heagney | 325/470 X |
| 3,602,822 | 8/1971 | Evans et al. | 325/470 |
| 3,641,434 | 2/1972 | Yates et al. | 325/421 X |
| 2,891,157 | 6/1959 | Hansel | 325/455 |
| 3,701,951 | 10/1972 | Krausser | 325/455 |

*Primary Examiner*—Benedict V. Safourek
*Attorney, Agent, or Firm*—Olson, Trexler, Wolters, Bushnell & Fosse, Ltd.

[57] ABSTRACT

Channel tuning equipment for a communications receiver comprises a channel selector for selecting, in coded form, the channel to which the receiver is to be tuned, circuitry for scan-tuning the channels, a sensor circuit for issuing pulses responsive to successive tunings of the channels, a binary counter responsive to the output of the sensor circuit, and a decoder operable in conjunction with the channel selector and the output of the counter for producing an output of a predetermined logic state only when the selected channel has been reached. The output at the predetermined logic state is utilized to effect a cessation of the scan-tuning either as a signal for manual stop tuning or as a command for automatic stop tuning. The receiver may be an FM receiver that is connected to a coaxial cable for selective tuning to a large number (e.g. several hundred) of channels.

16 Claims, 7 Drawing Figures

Inventor
Richard G. Reynolds
By: Olson, Trexler, Wolters & Bushnell attys

| DECIMAL | $\overline{BCD}$ |
|---|---|
| 0 | 1111 |
| 1 | 1110 |
| 2 | 1101 |
| 3 | 1101 |
| 4 | 1100 |
| 5 | 1011 |
| 6 | 1001 |
| 7 | 1000 |
| 8 | 0111 |
| 9 | 0110 |

Inventor
Richard G. Reynolds
By: Olson, Trexler, Wolters & Bushnell attys.

Inventor
Richard G. Reynolds
By: Olson, Trexler, Wolters & Bushnell attys.

CHANNEL TUNING ARRANGEMENT

BACKGROUND OF THE INVENTION

This invention relates to tuning of communications receivers and is particularly suitable for tuning FM radio receivers that are connected to the coaxial cable of a so called CATV system.

In the manual tuning of communications receivers, it is usual to provide an LC tuning circuit in which the receiver is tuned to a selected channel or frequency by changing either the inductance or the capacitance of the tuning circuit. In the case of FM receivers, manual tuning is often effected by a ganged variable capacitance or by the use of variable capacitance diodes called varactors. In either event the change in capacitance is not linear with respect to the change in resonant frequency of the tuning circuit with the result that most FM tuner dials are non-linear. This makes tuning to selected channels difficult for some persons, especially in areas where large numbers of FM stations may be broadcasting.

Where FM programming is transmitted over a coaxial cable, as may be done in CATV systems, it is possible and often desirable to distribute numerous (20 to several hundred) closely spaced FM audio channels. However, where a particularly large number of channels are transmitted, the foregoing difficulties of tuning are magnified. For example, if 100 channels are being sent over a cable of a CATV system and each channel were allotted one-tenth inch on the dial, the dial would be over 6 inches long. If two hundred channels were being broadcast, the dial would be over 12 inches long. Dials of these types are not practical for modest cost FM receivers even if they were made linear at added expense to the design of the receiver. In fact, a sic inch dial, which might be a manageable length in and of itself, is an exceedingly cramped space in which to tune one hundred channels. Of course, band switches similar to use on shortwave receivers could be used to provide dials of manageable length, but these too add expense and are difficult and confusing for the average subscriber to use.

Automatic tuning systems are, of course, known. One such system simply uses a motor to rotate the variable capacitor in the LC tuning circuit to scan-tune the channels. This simply motorizes an otherwise manual function. In another known system in which the tuning circuit uses varactors, the channels are scan-tuned by circuitry that automatically generates and applies the required tuning voltage for the varactors. In one mode of such system the user depresses a switch and the channels are successively scan-tuned. In another mode, when the user releases the switch, the scan-tuning stops. While this system tunes from channel to channel, it tends to skip over weak or low field strength signals making tuning of those channels difficult or uncertain. Furthermore, the user has no way of being certain that he has tuned to the correct channel except by dial inspection or guessing.

OBJECTS AND SUMMARY OF THE INVENTION

An object of this invention is to provide a channel tuning means for a communications receiver in which the user can set a selector for a channel to which the receiver is desired to be tuned so as to program the tuning means for tuning to that channel. The user then initiates the operation of the channel tuning means as by actuating a switch. The tuning means undergoes its programmed operation, scan-tuning the channels, until the selected channel has been reached after which the scan-tuning may be stopped. In one form of the invention a signal tells the user to stop the scan-tuning; in another form of the invention the scan-tuning is automatically stopped at the selected channel.

A further object of this invention is to provide an arrangement of the type stated in which the selection of the channel to be tuned may be from among a very large number of closely spaced channels. The user need not be concerned with dial reading and is always assured of tuning to the selected channel.

A still further object of this invention is to provide a tuning means of the type stated which operates on the principle of counting the channels as they are scan-tuned. When a predetermined number of channels has been counted (i. e. scan-tuned), a command signal is issued that may be used to inform the user to stop scan-tuning or may be used to stop automatically the scan-tuning.

Another object of this invention is to provide a tuning means of the type stated for use with receivers that are connected to a coaxial cable for reception of the various channels. CATV systems may include headend equipment for signal processing each of the channels to be received. As a result the number of channels (e.g. FM carriers), their respective frequencies, and their signal strengths would remain constant, all of which is in contrast to over-the-air signals, some of which may be weak, or even be off the air at certain times. This aspect of CATV transmission is utilized in the present invention to insure that each channel is counted as it is tuned during the scan-tuning. While the invention is most suitable for FM receivers connected to such cable system, the invention is not limited thereto.

In accordance with the present invention, the receiver has a selector or "programming device" operable independently of the tuning circuit for selecting a channel to be tuned. The receiver also has circuit means for producing an output of a predetermined characteristic only after the selected channel has been reached during scan-tuning of the channel, which output is used for automatic stopping of the scan-tuning or to signal to manually stop scan-tuning. The aforesaid circuit means may include a sensor circuit for issuing pulses responsive to successive channel tunings, a counter responsive to the output of the sensor circuit, and means responsive to the output of the counting means and the setting of the selector or programmer for producing the aforesaid output of predetermined characteristic.

DETAILED DESCRIPTION

Figure 1:
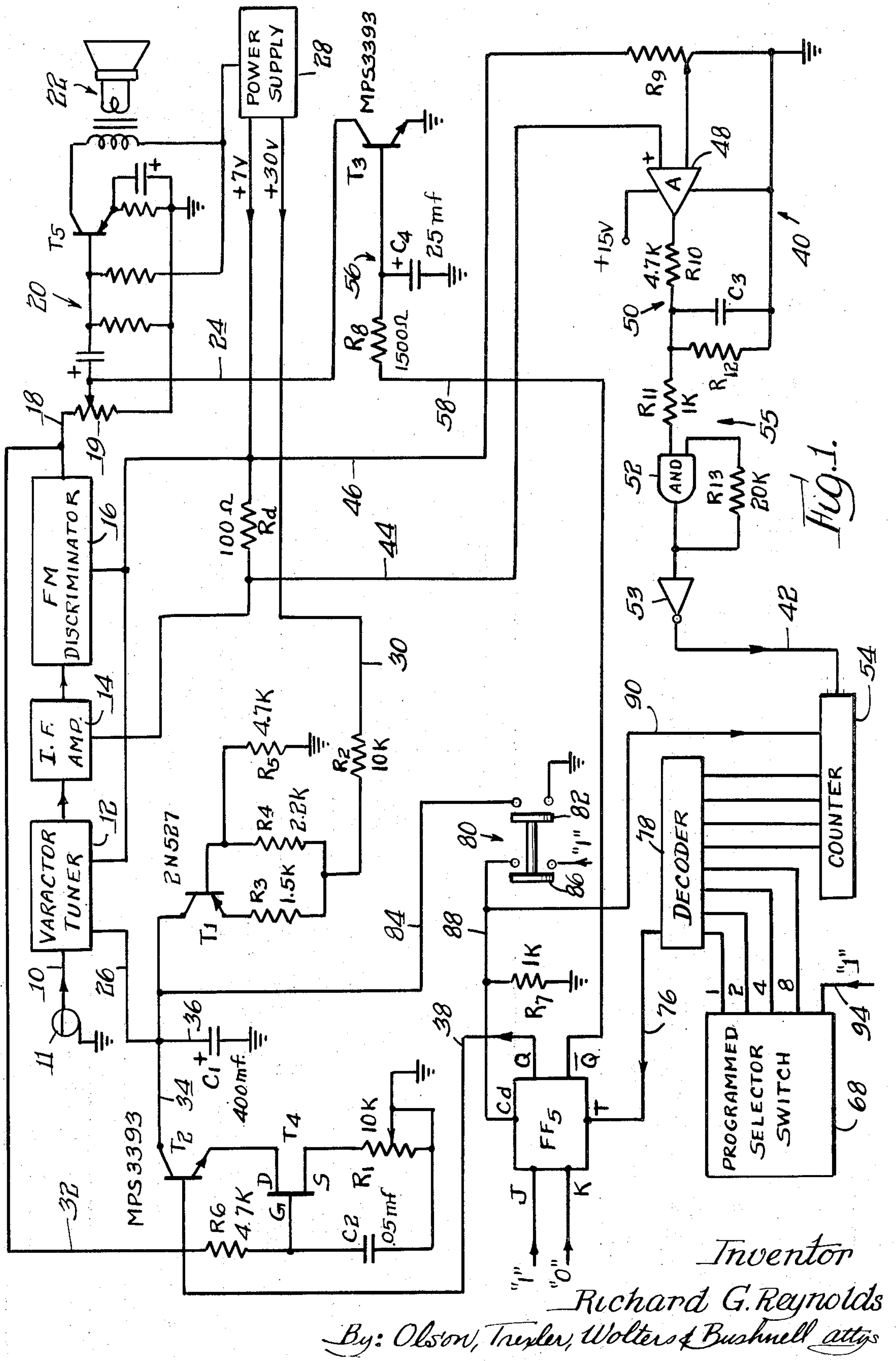
FIG. 1 is a diagram, partially schematic and partially in block form, of an FM tuner embodying the present invention.

Referring now in more detail to the drawing, and in particular to FIG. 1, there is shown an FM receiver that receives signals over input line 10 from a coaxial cable 11. The various frequency modulated carriers are sent from the headend of the cable system over the cable 11 in a known manner. Included in the FM receiver is a varactor tuner 12 the output of which goes to an IF amplifier 14 and then to a discriminator 16 where the carrier is demodulated to provide the audio output on conductor 18. The discriminator may be of the ratio detector type or may be a limiter-discriminator circuit of known design.

An audio amplifier 20 of known type is provided and includes transistor amplifier $T_5$ and loudspeaker system 22. At the input of the amplifier 20 is a level control 19. At the outputs of the level control 19 a conductor 24 is connected to provide a tapoff and by which the audio input signal may be grounded, for purposes presently more fully appearing. Since amplifier 20 is conventional and the invention is not limited to any particular kind of audio amplifier, further detailed explanation of the audio amplification circuitry is unnecessary.

The circuitry of the varactor tuner 12 is also known in the art. Suffice it to say, however, that the varactor tuner circuitry utilizes variable capacitance diodes known as varactors. These diodes exhibit a change in capacitance as the reverse-bias voltage is changed. Thus, increasing voltage decreases capacitance. As a result, the receiver is tuned by the application of a d.c. tuning voltage on conductor 26.

A power supply 28 supplies voltage to the tuner 12, amplifier 14, discriminator 16 and amplifier 20. In one form of the invention seven volts are applied to the tuner and discriminator while the seven volt supply is applied through one hundred ohm dropping resistor $R_d$ to the IF amplifier 14. Additionally, a thirty volt supply is applied through conductor 30 and resistor $R_2$ through a scan-tuning circuit that includes a constant current source made up of transistor $T_1$ and resistors $R_3$, $R_4$ and $R_5$. The scan-tuning circuit also includes capacitor $C_1$ that serves to apply the tuning voltage to the varactor tuner 12.

At this time it should be noted that various suggested values and types are indicated for certain of the components of the circuitry of the present invention. They are by way of example but not of limitation. These are placed next to the particular components shown in the drawing and are conventionally designated. Thus, resistors are in ohms or where "K" is used the value represents thousands of ohms. The values of the capacitors are in microfarads. Also to be noted is that the power supply to other systems to be hereinafter described are not shown as these are conventional and will be well understood by those in the art.

Also provided in the present invention is a lock tuning circuit that includes a field effect transistor $T_4$ having gate, drain and source terminals designated as G, D, and S. The lock tuning circuit also includes capacitor $C_2$ and variable resistor $R_1$. The gate G of transistor $T_4$ is coupled to the output of the discriminator 16 through conductor 32 and resistor $R_6$ whereby the voltage at the gate G will be proportional to the output voltage of the discriminator 16.

Transistor $T_2$ constitutes a logic-operated stop-scan arrangement which will hereinafter be described in more detail. For the present, it should be noted that the emitter of transistor $T_2$ is connected to the drain D of transistor $T_4$ while the collector of transistor $T_2$ is connected through conductor 34 to the positive side terminal 36 of capacitor $C_1$. The base of transistor $T_2$ is connected through conductor 38 to the Q output of flip-flop $FF_5$ that operates conventionally in the J-K mode. When the output on conductor 38 is at logic state "1" a signal is applied to the base of transistor $T_2$ causing it to conduct from collector to emitter. When the state of Q and conductor 38 are at state "0," transistor $T_2$ will not conduct.

A carrier sensor circuit 40 is provided for sensing the upscale tuning of each channel and for producing an output pulse on conductor 42 responsive to each channel passed through by the scan-tuning circuit. The input to the carrier sensor 40 is from conductors 44, 46 which, it will be noted, are across $R_d$, which is in the power supply line of the IF amplifier 14. Conductors 44, 46 are connected to differential amplifier 48 (for example, type 709), the conductor 46 being connected through variable resistance $R_9$. Resistor $R_9$ is adjusted so that normally the output of amplifier 48 is near zero volts. As the scan-tuning circuit tunes through a channel, there will be a change in voltage across resistor $R_d$. This change in voltage drop across $R_d$ will produce a maximum output from the differential amplifier 48 which may, for example, be of the order of one-half of the supply voltage, namely of the order of 7.5 volts. A voltage divider-filter circuit 50 made up of resistors $R_{10}$, $R_{12}$ and capacitor $C_3$ divides the output voltage applied to resistor $R_{11}$ so that the voltage thereat reaches the order of 1.5 volts when the tuner is at a center channel frequency. The voltage at the output of circuit 50 is near zero volts output when the tuner 12 is between channels. Resistors $R_{11}$ and $R_{13}$ together with AND gate 52 provide a fast rise and fall time for use in operating binary counter 54. It will be noted that the circuit comprised of $R_{11}$, $R_{13}$ and AND gate 52 is a conventional Schmitt trigger 55. Thus, the voltage from the voltage divider 50 should be sufficient to drive the Schmitt trigger 55. The output of the Schmitt trigger 55 prior to being sent to conductor 42 passes through an inverter 53 to provide the fall occurrence of each pulse at the time required for clocking the counter 54.

An audio muting circuit 56 is provided for grounding the audio signals sent into the amplifier 20 as the scan-tuning proceeds. For this purpose conductor 24 is connected to the collector of transistor $T_3$, the emitter being grounded, as shown. The audio muting circuit also includes capacitor $C_4$ and resistor $R_8$, the latter being connected through conductor 58 to the $\bar{Q}$ output of flip-flop $FF_5$. As will be seen hereafter, when $\bar{Q}$ of $FF_5$ is at state "1" a signal will be applied on conductor 58 and thus to the base of transistor $T_3$ causing the latter to conduct and thereby ground the audio signal on conductor 24. When $\bar{Q}$ is at state "0" no signal is applied on conductor 58 and transistor $T_3$ is in the non-conducting state.

Figures 2, 3, 5:
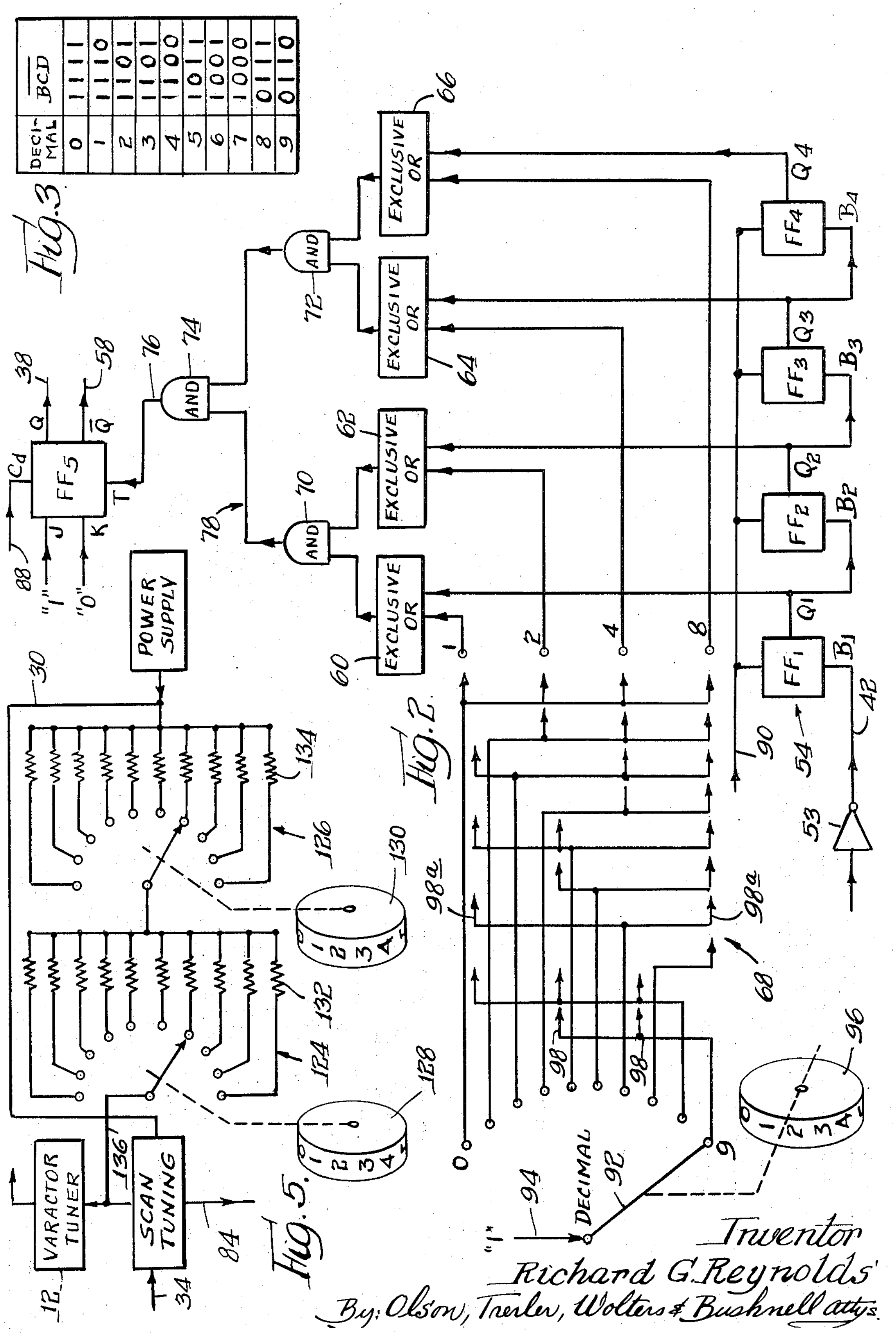
FIG. 2 is partially a logic diagram and partially a schematic and showing the selector switch, the counter, and the decoder which form part of the present invention.
FIG. 3 is a truth table for the selector switch.
FIG. 5 shows a modified form of the invention.

As will be seen from FIG. 2, the counter 54 is a conventional four bit binary counter that has flip-flops $FF_1$, $FF_2$, $FF_3$, and $FF_4$. The clock inputs are shown at $B_1$, $B_2$, $B_3$ and $B_4$ while the outputs are designated as $Q_1$, $Q_2$, $Q_3$ and $Q_4$ and so correspond to an 8–4–2–1 binary code. The $Q_1$ through $Q_4$ outputs are connected to exclusive OR gates 60, 62, 64, 66 as shown in FIG. 2. In addition, there is provided a programmed selector switch 68 which is of the complemented binary coded decimal type. This switch, though conventional, will be briefly described hereafter. For the present, however, the binary complemented outputs at 1, 2, 4 and 8 of the switch 68 are also sent to the exclusively OR gates 60, 62, 64, 66. It is to be understood that these exclusively OR gates produce an output only if the two inputs are logically complement. The outputs from the gates 60, 62, 64, 66 are sent to AND gates 70, 72, 74 as diagrammed in FIG. 2, and the output conductor 76 from AND gate 74 is sent to the clock input T of $FF_5$. Comparing FIGS. 1 and 2 it will be seen that the several exclusive OR gates 60 through 66 and the several AND gates 70 through 74 comprise a decoder 78.

Referring to FIG. 1, a normally open reset switch 80 (which may be a spring loaded push button) has a contact 82 for grounding the charge on capacitor $C_1$ through conductor 84. The reset switch 80 also has a contact 86 for applying a voltage at state "1" to conductors 88, 90. As noted in FIG. 2, a signal of state "1" on conductor 90 constitutes a preclear or reset for the flip-flops of the counter 54. A signal at logic state "1" on conductor 88 is applied to the $C_d$ terminal of flip-flops $FF_5$ and constitutes a direct clear input to the flip-flops to reverse the states of Q and $\bar{Q}$ when the switch 80 is open. Resistor $R_7$ assures normally that a low or state "0" appears at $C_d$.

A brief further description of the operation of flip-flop $FF_5$ will now be made. As previously pointed out, this flip-flop operates in the J-K mode. In the present invention the J input is always biased at state "1" whereas the K input is always biased at state "0." With the receiver being tuned to a channel but not scan-tuning the input at terminal $C_d$ is at "0" and no clock pulse appears at terminal T. Accordingly, Q will be at logic state "1" and $\bar{Q}$ will be at logic state "0." If a clock pulse arrives at T from conductor 76 the states of Q and $\bar{Q}$ will change on the negative going portion of the clock pulse. Likewise, if a signal at state "1" appears on conductor 88 and thus on $C_d$, (independently of the clock input) the states of Q and $\bar{Q}$ will also change. However, with J at "1" and K at "0" once Q is at "1" and $\bar{Q}$ is at "0" a further clock pulse at T will not cause the state of either Q or $\bar{Q}$ to change.

Referring now to the selector switch 68 that is diagrammed in FIG. 2, it will be seen that this switch is a complemented binary coded decimal switch having 10 decimal inputs and four outputs 1, 2, 4 and 8. Decimal terminals 0 and 9 are shown, reference numerals to the other decimal terminals being omitted so as not to obscure the drawing. The selector switch arm or contact 92 is connected to a voltage source at logic state "1" through conductor 94. It will be seen that the switch contact 92 is selectively engageable with any of the decimal contacts. A thumb wheel 96 may be used to rotate the switch contact 92, and the thumb wheel 96 may be conveniently housed to display the decimal selection. Such selection would ordinarily be the number of the channel to be selected. Selecting a certain channel in effect provides a decimal input for programming the switch 68. The complemented binary coded output will be apparent from the array of horizontal arrows representing the complemented binary coded outputs. For example, if decimal 9 were selected (the condition illustrated in FIG. 2), the complemented binary coded decimal output as represented by contacts 98, 98 would be 0110. Other outputs will be apparent from an inspection of the remaining contacts in FIG. 2. FIG. 3 shows the truth table for the switch 68 from which all of the outputs will be apparent. Thus, the outputs on one or more of the terminals 1, 2, 4, 8 provide a programmed arrangement for supplying input signals to the exclusive OR gates 60, 62, 64, 66. When the count from the counter 54 reaches a binary number corresponding to the binary output of the switch 68, a signal on conductor 76 will appear and clock flip-flops $FF_5$ to change the states of Q and $\bar{Q}$. For example, assume that the contact 92 was set at decimal "9." This would immediately apply a state "1" input to the exclusive OR gates 62, 64 through outputs 2, 4; however, the outputs from 1 and 8 to exclusive R gates 60, 66 remain at "0." When the binary counter 54 reaches decimal 9, the decoding logic is such that $Q_1$ and $Q_4$ are each at state "1" whereas $Q_2$ and $Q_3$ are each at state "0." Thus, signals will be applied at state "1" and "0" on all of the exclusive OR gates, and consequently a signal will appear on conductor 76. Since the decoding logic of the binary counter 54 is known in the art, further examples need not be given.

In use, it will be assumed that the receiver is tuned to some channel and it is desired to tune the receiver to another channel, for example channel no. six. The thumb wheel 96 is rotated to "6" which puts the selector contact 92 to the decimal six position. Signals at logic state "1" will now be applied from input 94 through selector contact 92 and the proper contacts (i. e. 98*a*, FIG. 2) to output terminals 1, 8 of the $\overline{BCD}$ switch 68 and to gates 60, 66. No logic "1" signals will be applied to gates 62, 64 from switch 68. At this time Q is at "1" and $\bar{Q}$ is at "0." No clock pulses are applied to T and $C_d$ is at "0" except possibly from noise, but this does not affect $FF_5$.

The reset switch 80 is now depressed and released causing a state "1" signal to be applied to $C_d$ to cause Q to become "0" and $\bar{Q}$ to become "1." A state "1" signal on conductor 90 resets the counter 54 to zero. Operation of the reset switch also grounds capacitor $C_1$ through conductor 84 an contacts 82 causing the tuning voltage on the varactor diodes of the tuner 12 to drop to zero, thus down-tuning to below the lowest channel. The ground on $C_1$ is removed when the switch 80 is released. In practice the reset switch 80 should be held closed long enough to fully ground out the capacitor $C_1$.

The capacitor $C_1$ now begins to charge from transistor $T_1$ through conductor 36. As the voltage across $C_1$ rises, that voltage will be applied through conductor 26 to the varactor tuner 12 to tune up scale. With Q now at "0" transistor $T_2$ ceases to conduct with the result that capacitor $C_1$ is not loaded by transistor $T_4$ and resistor $R_1$.

As the tuner 12 scans through each channel a change in voltage will appear across $R_d$ and will be sensed by the differential amplifier 48. This voltage change appears because the IF amplifier 14 is tuned and draws a maximum current when the tuner 12 is at center frequency of a channel. When the tuner is off channel a lesser amount of current is drawn so that there is a rise and fall of voltage across $R_d$ as the tuner 12 passes through a channel. It is the voltage drop across $R_d$ which occurs as the tuning is close to center channel but not yet at exact center channel that is used to provide the requisite input level for actuating the Schmitt trigger 55. The output of the differential amplifier 48 causes a pulse from the Schmitt trigger 55 (inverted by inverter 53) to appear on conductor 42. The inverter 53 is used in the circuit to assure that the count will advance when the center of a channel is approached rather than passed, it being noted that counter flip-flops change state when the clock falls. Also, it will be noted that the logic train from the Schmitt trigger 55 through the counter 54, decoder 78, and $FF_5$ operates very fast as compared to the rise and fall of the voltage across $R_d$. Also, since $\bar{Q}$ is now at state "1" a signal on conductor 58 causes transistor $T_3$ to conduct and ground out the audio information. This eliminates from the loudspeaker 22 the noise between channels.

Since each channel whose center frequency is closely approached causes a clock pulse on 42, those pulses serve as counts for the number of channels that are scanned. As seen in FIG. 2, when the requisite number of pulses (six in the present example being considered) have been fed into the counter 54, the outputs of the counter will be $Q_1$ and $Q_4$ at "0" and $Q_2$ and $Q_3$ at "1." Thus, at one input of each of the OR gates 60, 62, 64, 66 there will be a state "1" while at the other input to each of the OR gates there will be a state "0" condition. As a result signals will be sent to AND gates 70, 72, 74 causing a state "1" output to appear on conductor 76 and the clock input T of $FF_5$. At this time the tuner 12 will be tuning into the selected channel no. six, but will not be at the center frequency of channel no. six.

With a clock input to $FF_5$, the states of Q and $\bar{Q}$ change so that Q is "1" and $\bar{Q}$ is "0." An extra pulse from the clock T due to noise from conductor 76 will not cause the states of Q and $\bar{Q}$ to change since J and K are kept at "1" and "0" respectively. At this time the signal on conductor 58 is removed (since $\bar{Q}$ is at "0") and audio muting ceases.

As the tuning voltage across $C_1$ approaches the correct value for tune-in of the selected channel, the output on conductor 32 from the discriminator 16 will be negative as this represents the condition of the discriminator output upon tuning up scale into a channel and closely approaching center frequency of the channel. At this time Q will go to state "1" causing transistor $T_2$ to conduct. This places across the capacitor $C_1$ the shunt or load of the transistor $T_4$ and variable resistance $R_1$. This load or shunt is such that the load current from D to S of $T_4$ equals the charging current for the capacitor $C_1$ when the voltage on conductor 32 (and thus at gate G) finally reaches zero. This, of course, will occur when the tuner is at the center of the channel. $R_1$ may be adjusted to preset the required load for steady state (tuned to channel) conditions.

However, as stated above, the transistor $T_2$ begins to conduct just before tuning to center channel frequency whereby the discriminator output on conductor 32 and gate G will be negative but will be sweeping toward zero. In such condition this negative voltage at gate G reduces the load of the transistor $T_4$ allowing the voltage across $C_1$ to continue to rise until exact center channel tuning is reached, at which time the discriminator output voltage and thus the voltage at gate G is zero.

It will be seen that transistor $T_2$ serves as an electronic switch that stops the scan-tuning in response to the count of the counter 54 operating in conjunction with the selector 68. The transistor $T_4$ and associated circuitry function as a lock tuning to hold the tuner on channel by loading the capacitor $C_1$ so that the charging current and the discharging current are the same. Also, it should be noted that drift from the selected channel will be corrected and hence the arrangement provides an automatic frequency control. An increase in discriminator output voltage reflecting an upscale drift will increase the voltage at G, increase the load, and cause a decrease in the voltage across $C_1$. A decrease in discriminator voltage reflecting down scale drift will reduce the load and increase the voltage across $C_1$.

Figures 4, 6, 7:
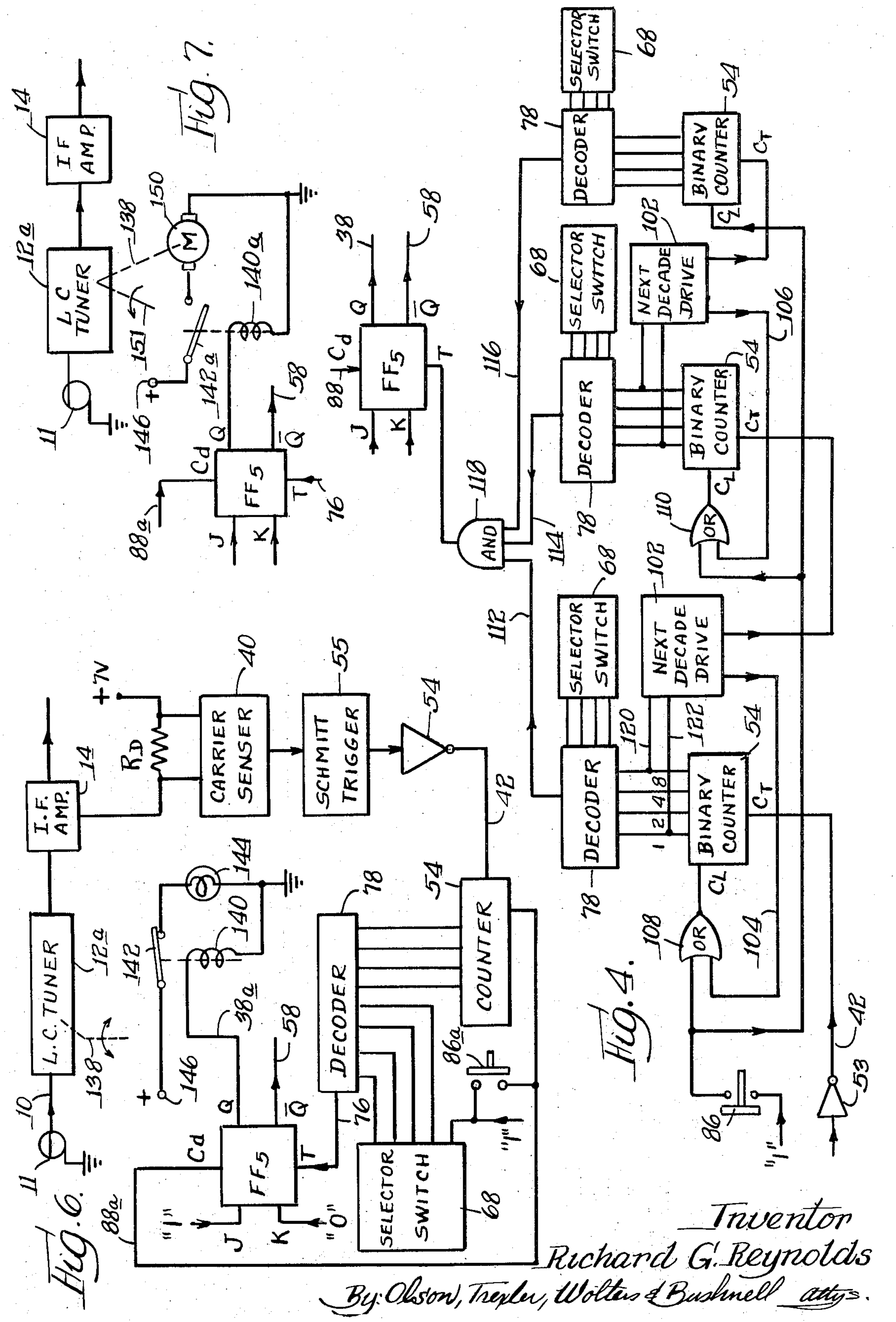
FIG. 4 shows a modified form of the invention in which additional decades are added to the counting arrangement of FIGS. 1 and 2.
FIG. 6 shows a further modified form of the invention that utilizes manual scan-tuning.
FIG. 7 shows still another modification of the invention that utilizes motorized automatic scan-tuning.

The foregoing arrangement shows a system for automatic tuning of 10 channels, but the number of channels may be increased, as shown in FIG. 4 by the use of additional decades in the counter, namely by the use of additional 8–4–2–1 binary counters 54. For this purpose each counter 54 has a clock input $C_T$ and a clear or reset $C_L$. Also, "next decade drive logics" 102 of conventional construction are employed. A selector switch 68 is used for each decade. It is seen that the arrangement shown utilizes "units," "tens" and "hundreds" decades. There are outputs from the decade drives 102, 102 which are fed back over conductors 104, 106 to OR gates 108, 110 so that the preceding decade can be cleared either by operating the reset switch to cause a state "1" voltage to be applied through contact 86 or by a pulse on conductors 104, 106, as the case may be.

In operation, when the first decade counts the tenth pulse, the next decade drive 102 sends a signal to the second decade counter 54 and also sends a signal over conductor 104 to reset or clear the first decade counter 54. This is necessary since each counter counts to 16 unless it is cleared. A like resetting of the second decade counter 54 takes place when the tenth pulse thereon is reached, thereby providing a signal over conductor 106 from the third decade drive to OR gate 110. Only when the requisite count has been reached will state "1" signals appear on decoder output lines 112, 114, 116 so that a signal from AND gate 118 will supply a clock pulse to T of $FF_5$ to cause the states of Q and $\bar{Q}$ to change. In connection with the operation of the decade drives 102, it will be noted that their inputs 120, 122 are connected to the "one" and "eight" outputs of the counters 54 respectively since these terminals will each be at state "1" at the tenth pulse (input at $C_T$) but not until that tenth pulse has been reached.

FIG. 5 shows a modified form of the invention which facilitates relatively rapid tuning of a selected channel where a large number (e. g. several hundred) channels are being transmitted over the coaxial cable 11. In essence, the arrangement of FIG. 5 depends upon the presence of a series of reference channels or bands transmitted over the cable 11 such that the reference bands are between each group of ten channels upon which program material is being transmitted and which may be selected by the subscriber. Each such reference band is of a width equal to the anticipated drift or instability of the receiver. Since all channels, reference or program-containing, emanate from the headend of the cable 11, the introduction of such reference bands is readily facilitated. In essence, therefore, the arrangement of FIG. 5 provides for the application of a tuning voltage through resistance to tune to a particular reference band, and scan-tuning upscale of the next ten channels in the manner described with reference to FIGS. 1 and 2.

Accordingly, FIG. 5 shows two resistor-type selector switches 124, 126 each of which has a movable selector operated by a decimal-indicating thumb wheel 128, 130. Each switch 124, 126 may be physically housed with a selector switch 68 so that to the user, the switch 126 indicates hundreds, the switch 124 indicates tens, and the selector switch 68 will indicate units. As shown, each switch 124, 126 has ten parallel connected resistors 132 or 134 so that any one of the resistors of the switch 124 may be connected in series with any one of the resistances 134 of the switch 126. The output from the selector of switch 124 is connected through conductor 136 to the tuning voltage input conductor 26 of the varactor tuner 12.

In use, the thumb wheels 128, 130 (FIG. 5) and 96 (FIG. 2) are set for the desired channel to which the receiver is to be tuned. With respect to the switches 124, 126, the appropriate resistors therein will now determine the voltage to be applied to conductor 26, and this will correspond to the reference band below and adjacent to the 10 channels that will be scanned upscale. When the reset switch 86 (FIG. 1) is actuated and ground is placed on conductors 84 and 26, the tuning voltage to the varactor tuner 12 will be grounded. As soon as the reset switch is released there will be applied to the varactor tuner 12 a tuning voltage from conductor 136 so that the tuner 12 will be immediately tuned to the reference band. Upscale scan-tuning will then proceed as each channel is sensed and counter by the counter in the manner heretofore described.

FIG. 6 shows a further modified form of the invention in which the scan-tuning is carried out manually. For this purpose the LC tuner 12*a* may include a ganged variable capacitor or a variable inductance. Assuming a variable capacitance, the latter is tuned by turning the operating shaft 138 for the same. The arrangement of FIG. 6 operates to a large extent like that of FIGS. 1 and 2 except that the automatic scan-tuning circuitry and the stop-tune and lock-tune circuitry are omitted. Instead, the output from terminal Q is sent over conductor 38*a* to a relay coil 140 which maintains normally open contact 142 closed for supplying voltage from source 146 to lamp 144 when Q is at state "1."

In use, the user down tunes manually the tuner 12*a* to the bottom of the scale and also opens the automatic frequency control switch of the receiver if the latter has one. The selector switch 68 is set to the desired channel and the reset button 86*a* is depressed to apply a state "1" signal on conductor 88*a* for purposes of resetting the counter 54 and also to change the states of Q and $\bar{Q}$. When this occurs the audio muting signal will appear on conductor 58, and since Q is now at state "0" the contact 142 will be disengaged and the lamp 144 will be out. As the tuner shaft 138 is rotated slowly to scan-tune up scale each channel is sensed by the carrier sensor circuit 40 and the counting of the channels takes place as heretofore described. When the selected channel has been reached a signal will appear on conductor 76 reversing the states of Q and $\bar{Q}$ to disable the audio muting and reclose the contact 142 so that the lamp 144 lights. The illumination of the lamp 144 signals that the selected channel has been reached so that the user stops scan-tuning. If desired, the automatic frequency control switch of the tuner may then be reactivated. In connection with FIG. 6 is should be noted that while only one selector switch 68 is shown, it is possible to add additional decades to this arrangement as shown in FIG. 4.

FIG. 7 shows a further modified form of the invention which is similar to FIG. 6 except that the variable capacitance (or inductance) of the tuner 12*a* has its shaft 138 driven by an electric motor 150. A manual override drive shaft 151 for the variable capacitance may also be provided. In the normal condition, namely where a channel is tuned in, Q is at state "1" so that the relay coil 140*a* is energized maintaining contact 142*a* open so that the motor 150 receives no voltage from the source 146 and is, therefore, not operating.

To effect automatic tuning, however, the manual override 151 may be used to down tune the tuner 12*a* to the bottom of the scale. If desired, however, a suitable arrangement, such as a reversing switch, may be used to reverse the direction of the motor 150 for this purpose. The selector switch 68 is set for the desired channel and the reset button 86*a* (FIG. 6) is operated whereby the arrangement of FIG. 7 operates like that of FIG. 6. Upon such reset, the Q output goes to state "0" whereby the coil 140*a* is deenergized so that the contact 142*a* closes to start the motor 150 rotating to scan-tune upscale. The carrier sensor and other circuitry operate as previously described and therefore need not be shown in FIG. 7. When the correct channel has been reached, the clock pulse on conductor 76 changes the states of Q and $\bar{Q}$. Since Q is now at state "1" the relay coil 140*a* is energized opening the contacts 142*a* to stop the motor 150. At this time the tuner is at the selected channel. The automatic frequency control switch of the receiver is then reclosed. However, it will be apparent that the circuit of FIG. 7 may embody an arrangement for automatically disabling the AFC switch upon reset of the system for scan-tuning, and by the same token the AFC switch could be reclosed when the selected channel has been reached. This may be done in various ways under control of the output of Q. For instance, an additional set of contacts operated by the coil 140*a* could be used.

The invention is claimed as follows:

1. In a communications receiver capable of being tuned to a plurality of channels, first circuit means including a tuner, means for connecting the input of said tuner to a coaxial cable having headend equipment for supplying channels of substantially constant signal strengths to said cable for reception by said tuner, an electrical to audio transducer, and circuitry intermediate said transducer and tuner and connected such that the channel signal is received by said tuner and is processed by said intermediate circuitry to provide a transducer output representing information on the channel; means operating the tuner for scan-tuning said channels in succession, selector means operable independently of the scan-tuning means for selecting a channel to be tuned from among said plurality of channels, second circuit means for producing an output of predetermined characteristic only when the selected channel has been reached during scan-tuning of the channels by said scan-tuning means, and means responsive to said characteristic output for utilizing said output upon reaching of said selected channel by the scan-tuning means for stopping said scan-tuning means; said second circuit means including a sensor circuit for issuing output pulses responsive to signals in said first circuit means due to successive tunings of the channels, counting means for counting the output pulses of said sensor circuit, and means responsive to the output of said counting means and the setting of said selector means for producing said characteristic output.

2. A receiver according to claim 1 in which the counting means includes at least one binary counter with outputs corresponding to a $2^3$, $2^2$, $2^1$, $2^0$ binary code.

3. A receiver according to claim 2 in which said selector means includes a binary coded decimal switch.

4. A receiver according to claim 1 in which said scan-tuning means is manually operable, and wherein said utilizing means has means indicating that the selected channel has been reached.

5. A receiver according to claim 1 in which said means operating the tuner is automatic and said utilizing means includes a circuit that stops said scan-tuning.

6. A receiver according to claim 5 in which the tuner has varactors and the automatic scan-tuning means includes means for applying a tuning voltage to said varactors.

7. A receiver according to claim 5 in which said automatic scan-tuning means includes a motor and the circuit that stops said scan-tuning operates to stop said motor.

8. A receiver according to claim 1 in combination with said headend equipment and said coaxial cable.

9. Channel tuning equipment for a communications receiver, said equipment comprising first circuit means including a tuner, means for connecting the input of said tuner to a coaxial cable having headend equipment for supplying channels of substantially constant signal strengths to said cable for reception by said tuner, an electrical to audio transducer, and circuitry intermediate said transducer and tuner and connected such that the channel signal is received by said tuner and is processed by said intermediate circuitry to provide a transducer output representing information on the channel; switch means for selecting a channel to be tuned from among a plurality of channels capable of being tuned by the receiver, voltage source means connected to said switch means to provide a coded output in accordance with the selected channel, scan-tuning means operating said tuner for tuning the channels in succession, a sensor circuit for issuing output pulses successively responsive to signals on said first circuit means due to the sensing by said sensing circuit of successive tunings of a plurality of said channels, counting means responsive to the output pulses of said sensor circuit, and second circuit means including decoding circuitry responsive to the output of said counting means and the output of said switch means for deriving an output of predetermined characteristic only when the selected channel is reached.

10. Channel tuning equipment according to claim 9 in which said counting means comprises a plurality of binary counters each having outputs corresponding to a $2^3$, $2^2$, $2^1$, $2^0$ binary code, said decoding circuitry being decoding circuits associated with each counter, the decoding circuitry of one counter being connected to that counter through a first conductor to clear that counter when it has counted a predetermined number of pulses from said sensor circuit and also to another counter through a second conductor to initiate said other counter.

11. Channel tuning equipment according to claim 9 in which said circuit means includes digital logic that is clocked by the output of said decoding circuitry such that one binary state of said decoding circuitry output indicates that the selected channel has not been reached and the opposite binary state of said decoding circuitry output indicates that the selected channel has been reached.

12. Channel tuning equipment according to claim 9 in which the scan-tuning is automatic, and wherein the decoding circuitry and the output of the counting means have cooperating means for deriving a signal characteristic that causes successive channel tuning through unselected channels, and for deriving said output of predetermined characteristic when the selected channel is reached.

13. Channel tuning equipment according to claim 9 in which said tuner is tunable in response to a tuning voltage applied thereto, and said switch means includes resistance means such that the coded output of said switch means also permits selective tuning to at least one band that is intermediate two groups of adjacent channels.

14. Channel tuning equipment according to claim 13 in which said switch means has a plurality of decades of selectability, there being one such band between each decade, the width of each said band being of the order of the anticipated drift of the tuning of the receiver.

15. In a communications receiver capable of being tuned to a plurality of channels, first circuit means including a tuner, means for connecting the input of said tuner to a coaxial cable, an electrical to audio transducer, and circuitry intermediate said transducer and tuner and connected such that the channel signal is received by said tuner and is processed by said intermediate circuitry to provide a transducer output representing information on the channel; means operating the tuner for scan-tuning said channels in succession, selector means operable independently of the scan-tuning means for selecting a channel to be tuned from among said plurality of channels, second circuit means for producing an output of predetermined characteristic only when the selected channel has been reached during scan-tuning of the channels by said scan-tuning means, and means responsive to said characteristic output for utilizing said output upon reaching of said selected channel by said scan-tuning means for stopping said scan-tuning means; said second circuit means including a sensor circuit for issuing output pulses responsive to signals in said first circuit means due to successive tuning of the channels, counting means for counting the output pulses of said sensor circuit, and means responsive to the output of said counting means and the setting of said selector means for producing said characteristic output; said receiver further including in said intermediate circuitry an amplifier for amplifying the channels tuned by said tuning means, means for applying a d.c. power supply voltage to said amplifier, said amplifier drawing a greater amount of current when the receiver is tuned to a channel than when tuned off channel; said first circuit means also including resistance means in the power supply to said amplifier for producing a voltage thereacross as a function of the current drawn by said amplifier, and said sensor circuit being connected to said resistance means for sensing the voltage across said resistance means.

16. A receiver according to claim 1 including a circuit providing a voltage indicative of tuning to a channel by said tuning means, and said sensor circuit includes means for sensing said voltage.

* * * * *